United States Patent
Harrat et al.

(10) Patent No.: US 8,620,239 B2
(45) Date of Patent: Dec. 31, 2013

(54) DYNAMIC DC-OFFSET DETERMINATION FOR PROXIMITY SENSING

(75) Inventors: Newfel Harrat, Burlingame, CA (US); Leonid Sheynblat, Hillsborough, CA (US); Kyoung Cheol Oh, Danville, CA (US)

(73) Assignee: QUALCOMM Incorporated, San Diego, CA (US)

( * ) Notice: Subject to any disclaimer, the term of this patent is extended or adjusted under 35 U.S.C. 154(b) by 233 days.

(21) Appl. No.: 13/007,397

(22) Filed: Jan. 14, 2011

(65) Prior Publication Data

US 2012/0183099 A1 Jul. 19, 2012

(51) Int. Cl.
*H04B 1/04* (2006.01)

(52) U.S. Cl.
USPC ............ 455/127.1; 455/154.1; 455/296; 455/127.2; 455/127.5

(58) Field of Classification Search
USPC ........... 455/403, 414.1, 421, 13.3, 13.4, 41.1, 455/41.2, 88, 553.1, 556.1, 562.1, 575.7, 455/132, 151.2, 456.1, 130, 67.11, 115.1, 455/226.1, 311, 296, 307; 324/76.12; 375/319, 346, 229, 285, 350
See application file for complete search history.

(56) References Cited

U.S. PATENT DOCUMENTS

| | | | |
|---|---|---|---|
| 6,518,561 B1 | 2/2003 | Miura | |
| 7,142,666 B1 | 11/2006 | Bates et al. | |
| 7,672,806 B2 | 3/2010 | Tronconi et al. | |
| 8,189,707 B1 * | 5/2012 | Khlat et al. | 375/268 |
| 2004/0102211 A1 * | 5/2004 | Ishida | 455/550.1 |
| 2004/0225904 A1 | 11/2004 | Perez et al. | |
| 2006/0280268 A1 * | 12/2006 | Sobchak et al. | 375/349 |
| 2009/0068974 A1 * | 3/2009 | Smith | 455/304 |
| 2009/0197615 A1 | 8/2009 | Kim et al. | |
| 2009/0235750 A1 | 9/2009 | Chang et al. | |
| 2010/0164479 A1 | 7/2010 | Alameh et al. | |
| 2010/0178929 A1 * | 7/2010 | Kennedy et al. | 455/456.1 |
| 2011/0043448 A1 * | 2/2011 | Yamamoto | 345/158 |
| 2012/0003929 A1 * | 1/2012 | Hyoung et al. | 455/41.1 |
| 2012/0129551 A1 * | 5/2012 | Islam | 455/456.1 |

FOREIGN PATENT DOCUMENTS

JP 10010596 A 1/1998

OTHER PUBLICATIONS

International Search Report and Written Opinion—PCT/US2012/021430—ISA/EPO—May 7, 2012.

* cited by examiner

*Primary Examiner* — Jean Gelin
(74) *Attorney, Agent, or Firm* — Michael Johnson

(57) ABSTRACT

The subject matter disclosed herein relates to dynamically determining DC-offset used for proximity sensing of a mobile device.

38 Claims, 5 Drawing Sheets

US 8,620,239 B2

DYNAMIC DC-OFFSET DETERMINATION FOR PROXIMITY SENSING

BACKGROUND

1. Field

The subject matter disclosed herein relates to dynamically determining DC-offset used for proximity sensing of a mobile device.

2. Information

Today, mobile products, such as smart cell phones or personal digital assistants (PDAs), come with a variety of features, which include, typically, a digital camera, satellite positioning system (SPS) capability, and/or an ability to wirelessly connect to the Internet, among others. Such mobile products typically employ liquid crystal displays (LCDs) which consume a substantial amount of the overall power consumed by such devices with limited battery life. Accordingly, selectively de-activating such an LCD display may extend battery life of a mobile product.

BRIEF DESCRIPTION OF THE FIGURES

Non-limiting and non-exhaustive features will be described with reference to the following figures, wherein like reference numerals refer to like parts throughout the various figures.

SUMMARY

Figure 1:
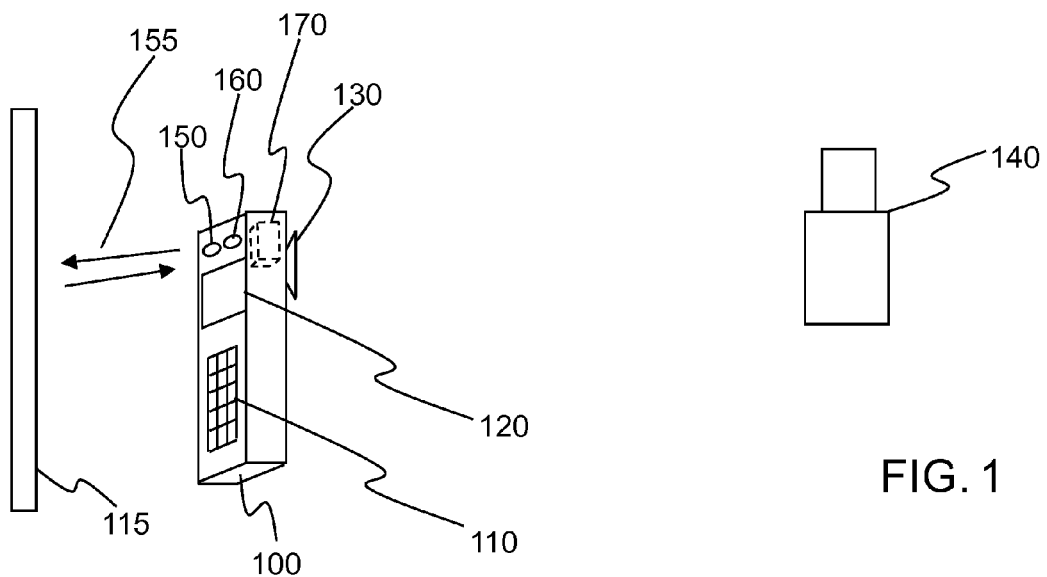
FIG. 1 is a schematic diagram showing a mobile device directed toward an object, according to an implementation.

In an implementation, a method may comprise receiving one or more signals from one or more inertial sensors on a mobile device, receiving a received power signal from a distance sensor on the mobile device, and estimating a DC offset component of the received power signal based, at least in part, on the one or more signals received from the one or more inertial sensors. It should be understood, however, that this is merely a particular example of methods disclosed and discussed throughout, and that claimed subject matter is not limited to this particular example.

DETAILED DESCRIPTION

Reference throughout this specification to "one example", "one feature", "an example" or "one feature" means that a particular feature, structure, or characteristic described in connection with the feature or example is included in at least one feature or example of claimed subject matter. Thus, the appearances of the phrase "in one example", "an example", "in one feature" or "a feature" in various places throughout this specification are not necessarily all referring to the same feature or example. Furthermore, the particular features, structures, or characteristics may be combined in one or more examples or features.

Mobile devices may employ LCD displays which, if illuminated, may consume a substantial portion of the overall power consumed by such devices. Here, an illuminated LCD may comprise an LCD displaying information, which may or may not incorporate backlighting for viewing in dark conditions, for example. Techniques may be employed to reduce power consumed by LCD displays in order to extend life of a battery on which a mobile device may rely. For example, in some implementations, a mobile device may have a built-in infrared (IR) sensor to detect whether a user has brought the device relatively close to the user's face or ear by. At such a relatively close distance, a user may be presumed to be listening and/or speaking on a cellular phone or other activities that involve placing the device close to the user's head. In such a case, a user is not likely to be looking at an LCD display of the device, and illuminating such a display may therefore be superfluous. Hence, if such a device is determined to be relatively close to a user's face or ear, the mobile device may turn off its LCD display to conserve power. On the other hand, a mobile device may be relatively far from a user's head (e.g., more than about six inches) if the user is taking a photo, tending to a received call and observing caller ID, entering or reading a text message, and so on. In such cases, it may be desirable to have the mobile device turn on its LCD display. In one implementation, detecting proximity of a mobile device to a user's head, for example, may be performed by emitting an IR signal and detecting intensity of the IR signal reflected from the user's head at an IR sensor. Of course, such details of a mobile device and its operation are merely examples, and claimed subject matter is not so limited. For example, although IR sensors are cited herein, sensors and/or emitters are not limited to such types of energy and/or wavelength, as discussed below.

In an implementation, a technique performed by a mobile device for proximity sensing using an IR sensor may involve use of an IR light emitting diode (LED) to emit an IR signal to a reflecting object such as a user's face, for example. An IR sensor may subsequently measure IR power reflected from the object to provide a received power signal. Here, intensity of a received power signal may depend, at least in part, on distance from a reflecting object. To detect objects at relatively close range, techniques for processing a received power signal from an IR sensor may involve subtracting out or otherwise compensating for a DC offset component in the received power signal. A DC offset may comprise an erroneous non-zero signal during which actual received power is substantially zero. Such a DC offset may arise from internal leakage power from an IR LED to an IR sensor, for example. Such a DC offset, without compensation (e.g., without subtracting out the DC offset), may result in proximity measurement errors. Such compensation may be difficult since DC offset may vary among individual mobile devices and vary over time. Compensating for DC offset may lead to determining an estimated actual reflection power as follows:

Actual reflecting IR power=Received IR−DC offset

Determination and subsequent compensation of a DC offset component may be performed, for example, by a calibration process in the manufacture/fabrication of a mobile device, for example. Unfortunately, DC offset may drift/change over time, such as during the course of hours, days, weeks, or years. Accordingly, a process to manually determine and subsequently compensate for a DC offset component may be performed repeatedly during the lifetime of a mobile device. Unfortunately, such a process, likely to be performed by a user, may be an unreasonable inconvenience. Of course, such details of techniques to determine DC offset are merely examples, and claimed subject matter is not so limited.

Particular implementations described herein relate to using techniques to automatically, e.g., without user interaction, determine and compensate for DC offset in a received IR power signal. Here, automatically implies that a user need not initiate a particular action directed to performing an adjustment of DC offset. Thus manual adjustment of DC offset by a user and/or a DC offset calibration process in the manufacture/fabrication of a mobile device may be unnecessary, for example.

In one implementation, a technique to estimate DC offset may involve determining an orientation of a mobile device wherein particular orientations may lead to a condition where DC offset is likely to be substantially equal to a received IR signal. For example, such a particular orientation of a mobile device may comprise a substantially face-up orientation, as described below. In a particular implementation, a process of estimating DC offset may comprise receiving one or more signals from one or more inertial sensors on a mobile device, receiving a power signal from a distance sensor on the mobile device, and estimating the DC offset of the received power signal based, at least in part, on the one or more signals received from the one or more inertial sensors. As described in further detail below, such inertial sensors may comprise one or more compasses, gravitometers, gyroscopes, pressure sensors, accelerometers, or any combination thereof, just to name a few examples. A distance sensor may comprise an infrared sensor, though claimed subject matter is not so limited. In a particular implementation, an orientation of a mobile device may be inferred based, at least in part, on one or more signals received from such inertial sensors. As a result, a range of the distance sensor to a reflective object may be determined based, at least in part, on the orientation of the mobile device as determined from inertial sensor signals. As mentioned above, one such orientation of the device may comprise a substantially face-up orientation and a reflective object may comprise a relatively distant ceiling or other overhead surface. Herein, the term "face-up" refers to orientation of a mobile device with respect to a side of the device that includes a distance sensor (e.g., an emitter/sensor pair), as described in further detail below. Of course, such details of techniques to determine DC offset are merely examples, and claimed subject matter is not so limited.

In one implementation, a technique to estimate DC offset may involve determining distance of a mobile device from a user's head, for example, by associating particular user events with relatively large distances. Such relatively large distances may lead to a condition where DC offset is substantially equal to a received IR signal. For example, such a relatively large distance may occur if a user is typing a text message on the mobile device, as described below. In a particular implementation, a process of estimating a DC offset may comprise receiving a power signal from a distance sensor on a mobile device, detecting a user event on the mobile device at a particular time, and estimating the a DC offset of the received power signal at such particular time in response to the user event. Examples of such a user event include a camera shutter click, entry of information by a user for text messaging, calculating numbers, and so on. Such entry of information may be performed via a user interface such as a keypad, stylus, voice command, and so on. In a particular implementation, a received power signal may be time-stamped to indicate the time that the power signal was received. Using such a time-stamp, a determination may be made as to whether the receive-time is within a particular time range of a user event. A DC offset may be estimated based, at least in part, on the outcome of such a determination. In another particular implementation, the value of an estimated DC offset may be confirmed based, at least in part, on one or more signals received from one or more inertial sensors. Of course, such details of techniques to determine DC offset are merely examples, and claimed subject matter is not so limited.

In an implementation, a mobile device may include features such as one or more inertial sensors to provide signals representative of orientation of the mobile device. One or more of such features may be employed to estimate a DC offset, as mentioned above for example. Such a mobile device may comprise a cell phone, a PDA, a camera, or any combination thereof, for example. In a particular implementation, a mobile device may include a DC offset component manager to estimate a DC offset component of a received power signal based, at least in part, on signals provided by one or more inertial sensors. For example, a DC offset component manager may comprise a special purpose computer application or other software to determine DC offset. Such DC offset determination may be performed dynamically, e.g., in real time, though claimed subject matter is not limited in this respect. A DC offset component manager may determine DC offset by inferring an orientation of the mobile device based, at least in part, on signals provided by one or more inertial sensors, and to infer a range of the mobile device to a reflective object based, at least in part, on the inferred orientation, as explained in detail below. Of course, such details of a mobile device are merely examples, and claimed subject matter is not so limited.

FIG. 1 is a schematic diagram showing a mobile device 100, according to an implementation. Mobile device 100 may include a camera and camera lens 130, a display 120, and/or a keypad 110. For example, such a camera may display a viewfinder image or a captured image in display 120. Mobile device 100 may also include a transducer 150 to emit a range-finding signal 155 and sensor 160 to detect a reflected portion of the range-finding signal. Such a range-finding signal 155 may comprise sound and/or electromagnetic energy, though claimed subject matter is not so limited. For example, transducer 150 may emit IR energy and sensor 160 may comprise an IR sensor. In a particular implementation, transducer 150 may emit IR energy substantially in a rearward direction, opposite the direction to where camera 130 faces. Such a rearward direction is likely where a user may be located while operating mobile device 100. Schematically, in FIG. 1, object 115 represents such a user. In particular, object 115 may comprise a user's face, head, or other body portion capable of reflecting a range-finding signal 155 such as that emitted by transducer 150, for example.

In some implementations, mobile device 100 may comprise an inertial sensor 170 to detect an orientation of the mobile device (e.g., face up, face down, upright, etc.). One or more signals from inertial sensor 170 may be used to infer whether device 100 is substantially face-up so that sensor 160 is pointed to a ceiling or the sky, for example. A ceiling would most likely be sufficiently far from sensor 160 such that reflected power received at the sensor may be assumed to be negligible. In a similar sense, the sky would likely not reflect measurable power to the sensor. Accordingly, in such cases where device 100 is substantially face-up, any detected power may be assumed to be equal to the DC offset component. For example, while such reflected power to the sensor is substantially zero, any power detected may instead comprise a DC offset component. Though claimed subject matter is not so limited, such a DC offset component may be a relic of sensor/emitter circuitry (e.g., electronic feedback, leakage, and so on) or other spurious signal. In addition to determining range of a reflective object (e.g., ceiling or sky) to the sensor as being associated with a substantially face-up orientation of device 100, user/hand gestures may be used to also infer the range of a reflective object to the sensor. In one particular implementation, a substantially face-up orientation may provide an opportunity to determine DC offset. Such a face-up orientation may also indicate a situation where an LCD display, such as display 120, may be illuminated, since a user may likely use the display during such orientation. In a particular example, a face up event combined with a period of relative rest (e.g., substantial lack of motion of a mobile device) may indicate that a mobile phone has been picked up and is momentarily in a relative rest position, such as if a user has picked up the mobile phone to answer a call and looked at a caller ID before bringing the mobile device to the user's ear. Calibration of a proximity sensor in the mobile phone may be triggered at this time. In another particular example, a face down event combine with a relatively long rest period may indicate that a mobile device is resting on a table or desk so that proximity sensors may be covered (e.g., blocked at a relatively short distance). In such a case, calibration of a proximity sensor may be set to zero distance. Of course, such details of mobile device 100 are merely examples, and claimed subject matter is not so limited.

In some implementations, a user action, such as taking a photo via an on-board camera, may lead to an opportunity to determine DC offset. For example, as shown in FIG. 1, one face of mobile device 100 may have a camera lens 130 to receive visible light to be detected while a camera view is provided on display 120, which may comprise an LCD screen, on a side opposite the lens. Camera lens 130 may be directed toward an object or scene 140 of which a photo is to be taken. An IR sensor, such as sensor 160 may be placed on the same surface/side of the mobile device as an LCD screen camera view. As such, it is likely that while taking a photo, a user is facing the LCD camera view (and the IR sensor) about 12.0 inches away from the IR sensor. Of course, 12.0 inches is merely an illustrative example: such a distance may be several inches less than or greater than 12.0 inches. Claimed subject matter is not limited in this respect. Accordingly, a camera shutter click signal, resulting from a user taking a photo, may be indicative of the user viewing the camera view LCD portion at about 12.0 inches or so from the user's face. Thus, such an assumed range from the IR sensor to the user's face may be used as an opportunity to estimate DC offset for the IR sensor. As mentioned above, in such a case where the IR sensor is directed towards a user's face that is about 12.0 or so inches away, detected IR power may be assumed to be equal to DC offset. For example, any IR power detected at a time when reflected IR power should be substantially zero may instead comprise DC offset, which may be a relic of sensor/emitter circuitry (e.g., electronic feedback, leakage, and so on) or other spurious signal. Accordingly, an expected reflected power from an object (e.g., a user's face) at about 12.0 inches from the device may be subtracted from a received power signal to measure and/or estimate a DC offset component in the received power signal. Of course, such details of techniques to determine DC offset are merely examples, and claimed subject matter is not so limited.

Figure 2:
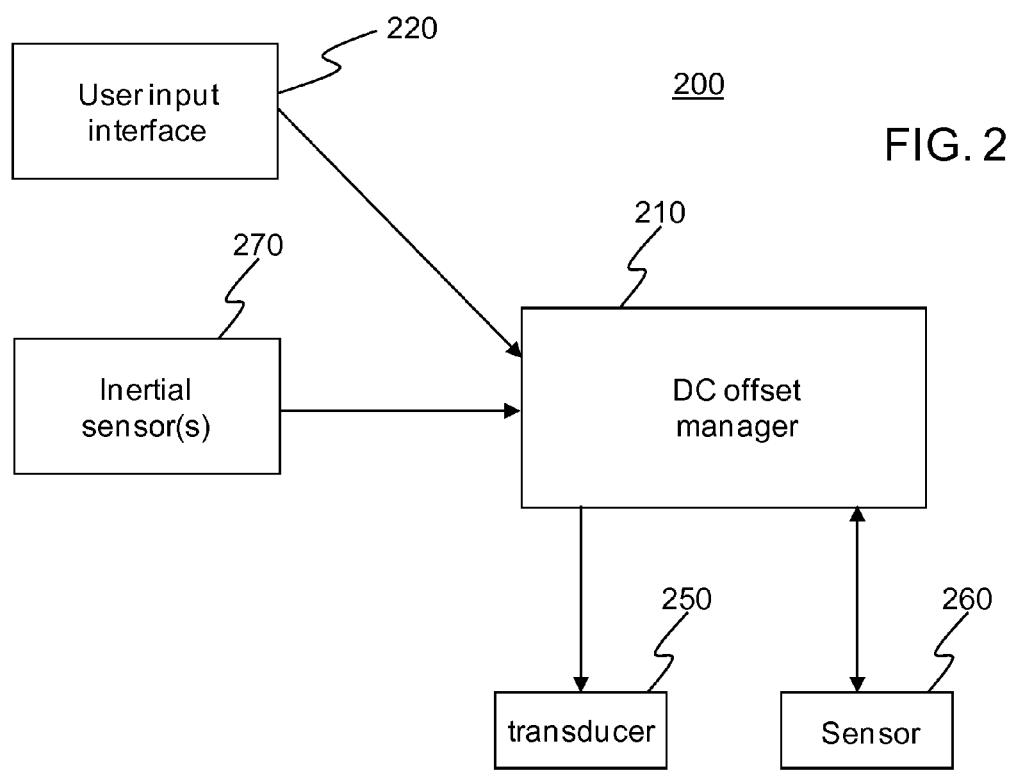
FIG. 2 is a block diagram of an orientation sensing system of a mobile device, according to an implementation.

FIG. 2 is a block diagram of an orientation sensing system 200 of a mobile device, according to an implementation. For example, such a mobile device may be the same or similar to mobile device 100 shown in FIG. 1, though claimed subject matter is not so limited. As discussed above, for example, it may be desirable to detect proximity of a mobile device with respect to a user's face or head to determine whether to turn on/off an LCD backlight of a display, such as display 120 shown in FIG. 1. Accordingly, for proximity detection, system 200 may include an emitter-sensor pair, which may comprise transducer 250 and sensor 260. For example, transducer 250 may comprise a light-emitting diode (LED) or laser diode to emit electromagnetic energy such as IR energy. In an alternative implementation, transducer 250 may comprise an audio speaker to emit sound energy. Sensor 260 may be selected from among any number of electromagnetic and/or sound energy detecting devices. Such selection may be based, at least in part, on the type of transducer 250 that is used. For example, transducer 250 may comprise an IR emitter, and sensor 260 may comprise an IR receiver, though claimed subject matter is not so limited. Transducer 250 and/or sensor 260 may be electronically coupled to a DC offset manager 210. In particular, DC offset manager 210 may operate transducer 250 to selectively emit electromagnetic and/or sound energy. Signals received (e.g., detected) by sensor 260 may be provided to DC offset manager 210. Such signals may be amplified or otherwise processed and/or converted before being provided to DC offset manager 210, though claimed subject matter is not limited in this respect. In one particular implementation, DC offset manager 210 may comprise a special purpose computer application or other software. In another particular implementation, DC offset manager 210 may comprise electronic circuitry such a logic gates, a processor to execute software, and/or other electronic components, though claimed subject matter is not so limited.

Proximity of mobile device 100 to a nearby (reflecting) object, such as a head or face, may be ascertained by determining the portion of electromagnetic and/or sound energy emitted by transducer 250 that is detected by sensor 260, for example. Generally, the closer the object, the greater the reflecting signal that is detected. In a particular case of a reflecting object being nonexistent or relatively far away from the mobile device, sensor 260 may detect a null, or substantially zero signal. However, as mentioned above, such a signal may instead be non-zero due to DC offset. Thus, DC offset may be determined if one assumes that a signal provided by sensor 260 is substantially equal to the DC offset during a situation where a reflecting object is relatively far away or nonexistent. Accordingly, orientation sensing system 200 may comprise features and/or components to enable a mobile device to determine its orientation. In an implementation, a technique to determine DC offset may involve such a determination of orientation of the mobile device (e.g., relative to a user's head or a ceiling). In particular, such components may comprise one or more inertial sensors 270. As discussed above, some examples of inertial sensors 270 may include one or more accelerometers, gravitometers, magnetometers, gyroscopes, compasses, or any combination thereof. Inertial sensors 270 may provide one or more signals representative of orientation of the mobile device to DC offset manager 210. For example, inertial sensors 270 may provide electronic signals to DC offset manager to indicate that sensor 260 of the mobile device is currently substantially face-up. In such a case, DC offset manager 210 may determine DC offset by assuming that a signal provided by sensor 260 is substantially equal to the DC offset, as discussed above.

In an implementation, orientation sensing system 200 may comprise a user input interface 220 such as keypad 110 shown in FIG. 1. Indications of actions by a user via user input interface 220 may be provided to DC offset manager 210. Such actions may indicate particular proximity and/or orientation of the mobile device with respect to a user's head. For example, a user entering information on keypad 110 may indicate that the mobile device is not near the user's head. In another example, a user clicking a button to take a photo may also indicate that the mobile device is not near the user's head. In such cases, DC offset may be determined by DC offset manager 210 by assuming that a signal provided by sensor 260 is substantially equal to the DC offset during a situation while a reflecting object (e.g., a user's head) is relatively far away. Of course, such details of an orientation sensing system and techniques to determine DC offset are merely examples, and claimed subject matter is not so limited.

Figure 3:
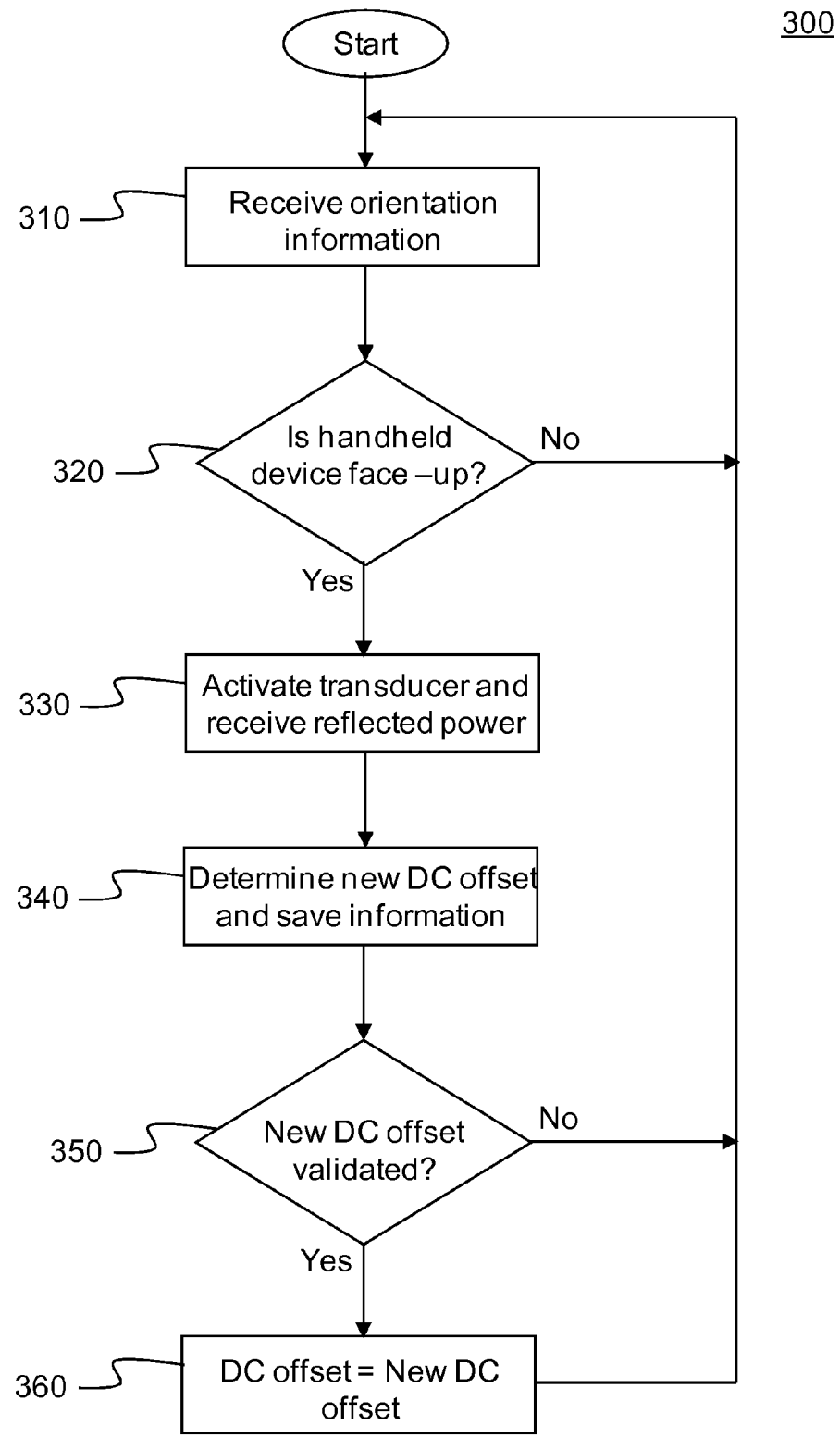
FIG. 3 is a flow diagram of a process for determining a DC offset, according to an implementation.
Figure 6:
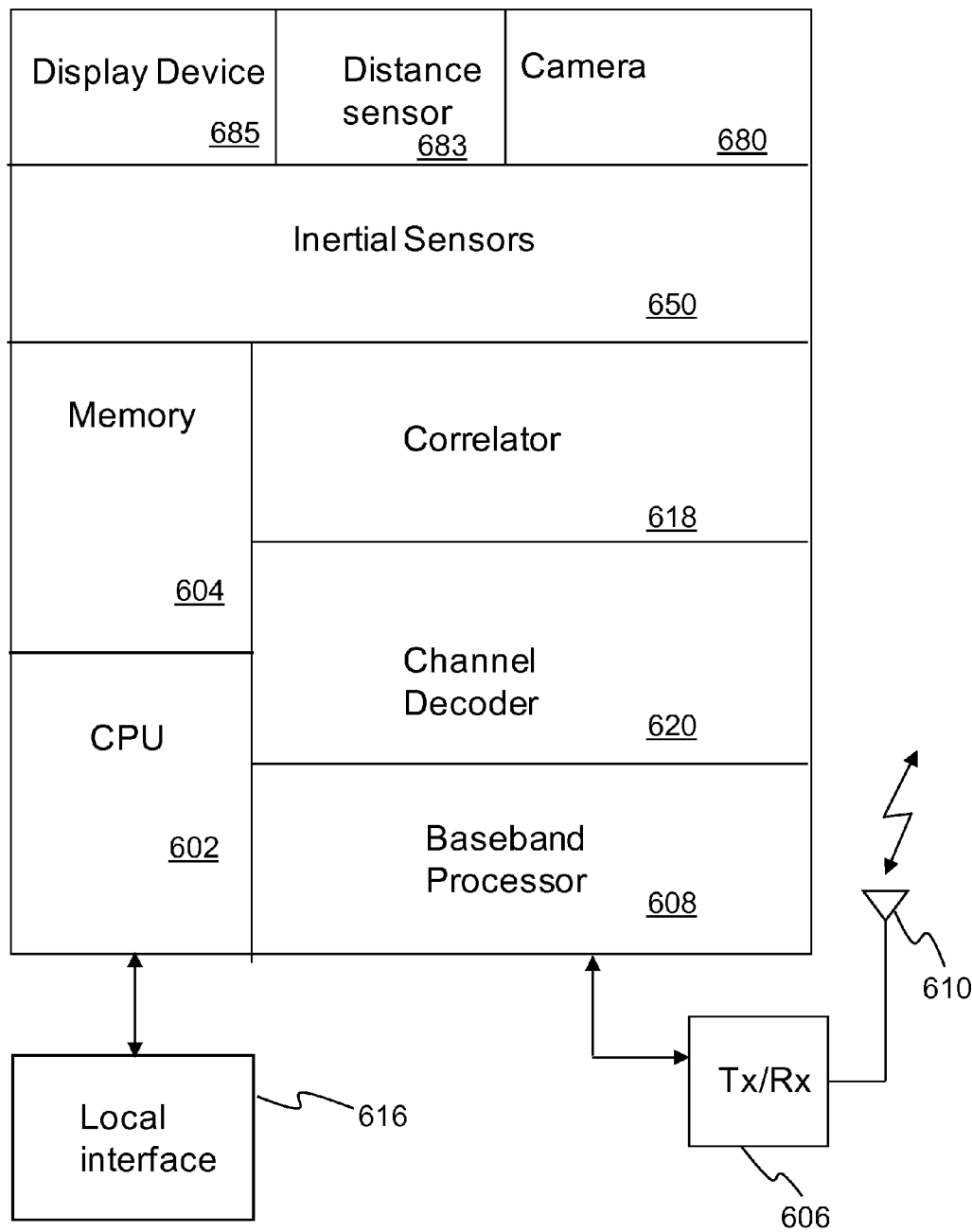
FIG. 6 is a schematic diagram of a mobile device incorporating a camera and being capable of sensing its orientation and communicating with a wireless network, according to an implementation.

FIG. 3 is a flow diagram of a process 300 for determining DC offset, according to an implementation. For example, process 300 may include a technique to estimate a DC offset component by receiving one or more signals from one or more inertial sensors on a mobile device, receiving a received power signal from a distance sensor on the mobile device, and estimating the DC offset component of the received power signal based, at least in part, on the one or more signals received from the one or more inertial sensors. At block 310, a DC offset manager, such as DC offset manager 210 shown in FIG. 2 for example, may receive one or more signals from one or more inertial sensors to indicate an orientation of a mobile device. Such an orientation may be with respect to gravity, for example. Accordingly, at block 320, a determination may be made as to whether or not the mobile device is substantially face-up. If not, then process 300 may return to sample orientation information provided by one or more inertial sensors, as at block 310. If, however, the mobile device is determined to be substantially face-up then process 300 may proceed to block 330, where transducer 250 and sensor 260 are activated to emit and receive a proximity-sensing signal, such as an IR signal described above. Since the mobile device is determined to be substantially face-up, DC offset manager 210 may assume that there are no actual objects, such as a user's head, relatively near the mobile device to reflect an IR signal. In such a case, any IR power detected at a time while reflected IR power should be substantially zero may instead comprise a DC offset component. Accordingly, at block 340, a new DC offset may be considered to be substantially equal to measured reflected IR power. Such a new DC offset may be stored in a memory (FIG. 6). At block 350, the new DC offset value determined at block 340 may be compared with previous measured values of DC offset that are stored in memory. Such comparison may be part of a technique to measure a persistence of measured DC offset values over time. In other words, a measured DC offset value may change relatively quickly or maintain a substantially constant value over a period of time. As described below, such measured DC offset values may be applied as new updated DC offset values to be used during subsequent proximity calculations. In a particular implementation, a new DC offset value that is lower than a previously measured DC offset value may be applied (e.g., at block 360, described below) relatively quickly. In contrast, a new DC offset value that is higher than a previously measured DC offset value may be applied after a particular delay, though claimed subject matter is not so limited. Also at block 350, DC offset manager 210 may determine whether the value of the newly determined DC offset is within a valid range. If not, then process 300 may return to sample orientation information provided by one or more inertial sensors, as at block 310. If, however, the newly determined DC offset is within a valid range, then process 300 may proceed to block 360, where the newly determined DC offset may be applied as the new updated DC offset to be used during subsequent proximity calculations. Meanwhile, after block 360, process 300 may return to block 310 for another possible opportunity to determine a new, updated DC offset. For example, such an opportunity may occur if the mobile device is again in a substantially face-up orientation. Such an occurrence may be, just to give some examples, a few seconds or a few weeks after the previous such occurrence. During such time spans, DC offset may drift so that determining a new, updated DC offset may be desirable. In any case, DC offset manager 210 may carry out process 300 automatically, without user effort and/or without a user aware of such a process. Of course, such details of determining DC offset in process 300 are merely examples, and claimed subject matter is not so limited.

Figure 4:
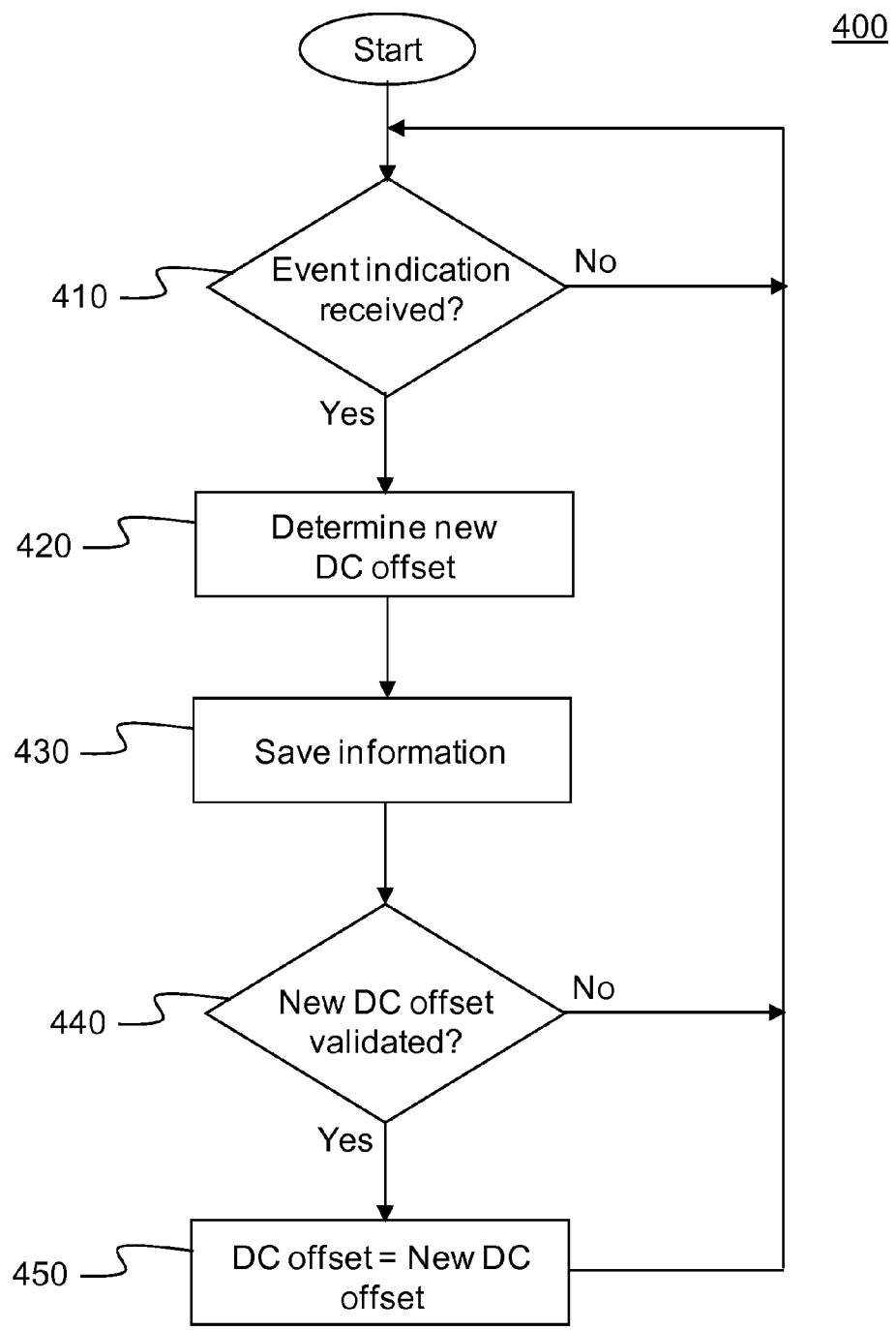
FIG. 4 is a flow diagram of a process for determining a DC offset, according to another implementation.

FIG. 4 is a flow diagram of a process 400 for determining DC offset, according to another implementation. For example, process 400 may include a technique to estimate a DC offset component by receiving a power signal from a distance sensor on a mobile device, detecting a user event on the mobile device at a particular time, and estimating the DC offset component of the received power signal at such particular time in response to the user event. At block 410, a DC offset manager, such as DC offset manager 210 shown in FIG. 2 for example, may receive one or more signals from a user input interface 220, for example, to indicate a user event. Such a user event may include a camera shutter click, entry of information by a user for text messaging, calculating numbers, or receiving a caller ID, just to name a few examples. Process 400 may wait until user input interface 220 indicates a user event. Upon occurrence of such a user event, DC offset manager 210 may assume that there are no actual objects, such as a user's head, relatively near the mobile device to reflect an IR signal, as explained above. In such a case, any IR power detected at a time when reflected IR power should be substantially zero may instead comprise a DC offset component. Accordingly, at block 420, a new DC offset may be considered to be substantially equal to measured reflected IR power. At block 430, such a new DC offset may be stored in a memory (FIG. 6). At block 440, the new DC offset value determined at block 420 may be compared with previous measured values of DC offset that are stored in memory. Such comparison may be part of a technique to measure a persistence of measured DC offset values over time. Also at block 440, DC offset manager 210 may determine whether the value of the newly determined DC offset is within a valid range. If not, then process 400 may return to wait for a subsequent user event, as at block 410. If, however, the newly determined DC offset is within a valid range, then process 400 may proceed to block 450, where the newly determined DC offset may be applied as the new updated DC offset to be used during subsequent proximity calculations. Meanwhile, after block 450, process 400 may return to block 410 for another possible opportunity to determine a new, updated DC offset. For example, such an opportunity may occur at the next user event, which may be anywhere from a few seconds to a year or so after the previous such occurrence. During such time spans, DC offset may drift so that determining a new, updated DC offset may be desirable. In any case, DC offset manager 210 may carry out process 400 automatically, without user effort and/or without a user aware of such a process. Of course, such details of process 400 are merely examples, and claimed subject matter is not so limited.

Figure 5:
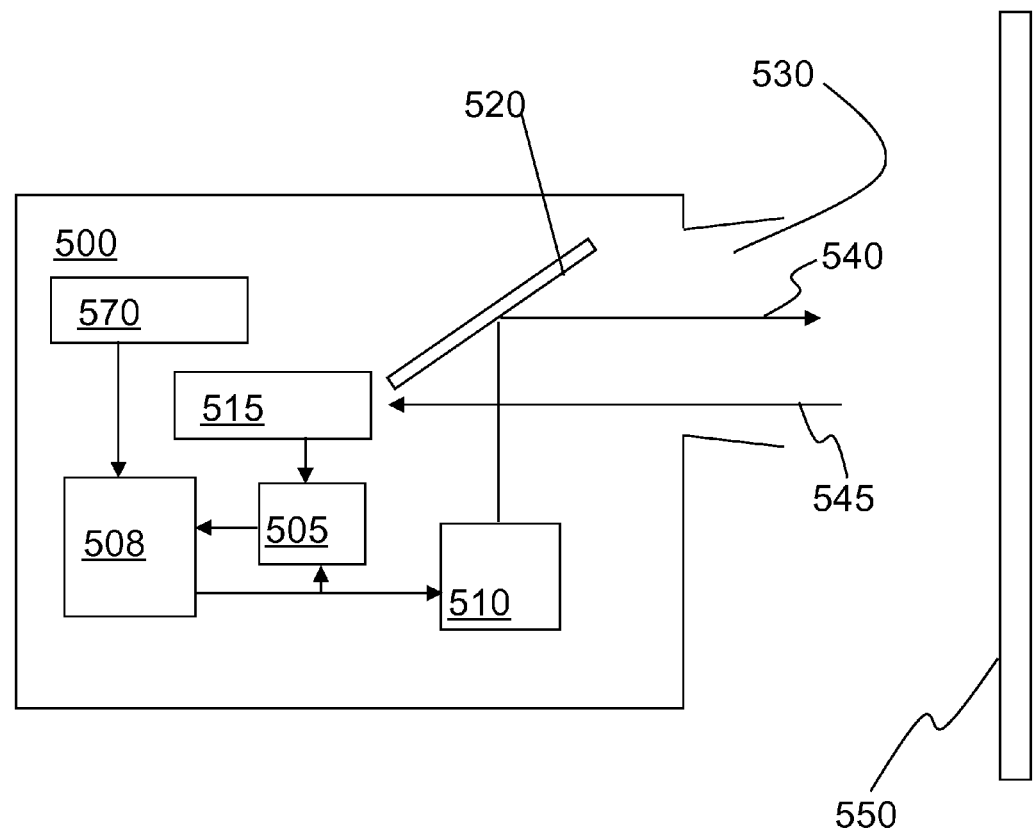
FIG. 5 is a schematic diagram showing a mobile device to measure a range to a surface, according to an implementation.

FIG. 5 is a schematic diagram showing a mobile device 500 that includes a distance sensor for measuring proximity and/or distances by detecting a presence of a surface 550, such as a user's head, face, ears, and so on, according to one implementation. In one particular implementation, a distance sensor may transmit or receive sound energy comprising substantially directed sound waves having subsonic or supersonic frequencies. In an alternate implementation, a distance sensor may transmit and receive EM energy such as laser light having visible or IR wavelengths. Of course, such descriptions of sound and EM energy are merely examples, and claimed subject matter is not so limited. Whether EM or sound, such energy may be generated via one or more transducers powered by voltage generators, for example. Such energy may comprise a pulse of energy, e.g., a relatively short wave-train of sound or EM energy having a begin and end time. Such a pulse may be encoded, for example, to provide a means for distinguishing multiple received pulses from one another. Subsequently, energy reflected from a surface may travel back to a distance sensor, where a measurement of time elapsed between emission and reception at the receiver may be performed. Such an elapsed time may be referred to as propagation time. Using knowledge of the speed of sound or EM energy emitted and received by the distance sensor and the measured propagation time, a distance from the distance sensor to the remote surface may be determined. Such a distance sensor may be used to determine a presence or proximity to a user or ceiling of an indoor space, for example. In another implementation, a receiver may receive energy reflected from a surface so that proximity and/or distance may be determined by comparing power of received energy with emitted energy.

Mobile device 500 may incorporate inertial sensors 570 to measure orientation of device 500, for example. Upon receiving emitted energy from an emitter 510, an optional reflector 520, which may be fixed with respect to the device, may direct energy 540 via opening 530 toward surface 550. Emitter 510 may comprise an omni-directional or directional emitter. In a particular implementation, emitter 510 may comprise an ultrasonic transducer such as a ceramic piezoelectric device or a polymer piezoelectric film (PVDF). In another particular implementation, emitter 510 may comprise an IR or visible LED, though claimed subject matter is not so limited.

A special purpose processor 508 may receive information from inertial sensors 570 adapted to measure angles in various planes of motion. Of course, such a description of device 500 is merely an example, and claimed subject matter is not so limited. In one implementation, a receiver 515 may receive energy 545 reflected from surface 550 after a propagation time delay from the time energy 540 was emitted from emitter 510. Receiver 515 may comprise a microphone or a Photosensor, for example. Such a delay may be measured by a time module 505, which may monitor signals transmitted from processor 508 to emitter 510 that initiate the emitter to emit energy 540, for example. Accordingly, time module 505 may measure a time difference between the time energy 540 is emitted and the time energy 545 is received. Time module 505 may involve digital time domain correlation, but analog time domain correlation may be utilized in other implementations. In a particular implementation, a lack of receive energy 545 may indicate that a surface 550 does not exist, which may be the case if the device is oriented substantially face-up and/or positioned relatively far from a user's head, as described above.

In another implementation, receiver 515 may receive energy 545 reflected from surface 550 so that proximity and/or distance may be determined by comparing power of received energy 545 with emitted energy 540. As just described, a lack of receive energy 545 may indicate that a surface 550 does not exist, which may be the case if the device is oriented substantially face-up and/or positioned relatively far from a user's head. Of course, such details of a mobile device are merely examples, and claimed subject matter is not so limited.

FIG. 6 is a schematic diagram of mobile device 600 capable of sensing its orientation and communication with a wireless network, according to one implementation. Such a device may include a camera 680. In a particular implementation, device 600 may be similar to device 100 shown in FIG. 1, for example. Device 600 may be adapted to communicate with a wireless communication network through antenna 610. Here, a radio transceiver 606 may be adapted to modulate an RF carrier signal with baseband information, such as data, voice, or SMS messages, onto an RF carrier, and demodulate a modulated RF carrier to obtain such baseband information. Antenna 610 may be adapted to transmit a modulated RF carrier over a wireless communications link and receive a modulated RF carrier over a wireless communications link.

Baseband processor 608 may be adapted to provide baseband information from central processing unit (CPU) 602 to transceiver 606 for transmission over a wireless communications link. Here, CPU 602 may obtain such baseband information from a local interface 616 which may include, for example, environmental sensory data, motion sensor data, compass data, acceleration information (e.g., from an accelerometer), proximity to other networks (e.g., ZigBee, Bluetooth, WiFi, peer-to-peer). Such baseband information may also include position information such as, for example, an estimate of a location of device 600 or information that may be used in computing same such as, for example, pseudorange measurements. Channel decoder 620 may be adapted to decode channel symbols received from baseband processor 608 into underlying source bits. In an implementation, CPU 602 may implement a DC offset manager, such as DC offset manager 210 shown in FIG. 2, for example. Local interface 616 may include a user interface such as keypad 110 shown in FIG. 1, for example.

Memory 604 may be adapted to store machine-readable instructions which are executable to perform one or more of processes, examples, implementations, or examples thereof which have been described or suggested. CPU 602, which may comprise a special purpose processor, may be adapted to access and execute such machine-readable instructions. However, these are merely examples of tasks that may be performed by a CPU in a particular aspect and claimed subject matter in not limited in these respects.

In an implementation, inertial sensors 650 may include one or more transducers to measure a motion of device 600, as described above, for example. Such a motion of device 600 may include a rotation or a translation. Measurements of one or more such motions may be stored in memory 604 so that stored measurements may be retrieved for use in determining an orientation of device 600 relative to the sun, as in explained above, for example.

In an implementation, image capturing device 680 may comprise a camera including a charge coupled device (CCD) array or a CMOS array of light sensors, focusing optics, a viewfinder, or interfacing electronics to communicate with CPU 602 and memory 604, for example. Display device 685 may comprise an LCD that, in some implementations, may be touch sensitive to provide means for user interaction. Display device 685 may operate as a viewfinder for image capturing device 680, though claimed subject matter is not so limited. Images, DC offset, or other information may be stored in memory 604. Device 600 may include a distance sensor 683 comprising an emitter-sensor pair such as transducer 250 and sensor 260 shown in FIG. 2, for example. Of course, such details of a device 600 are merely examples, and claimed subject matter is not so limited.

Methodologies described herein may be implemented by various means depending upon applications according to particular features or examples. For example, such methodologies may be implemented in hardware, firmware, software, or combinations thereof. In a hardware implementation, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other devices units designed to perform the functions described herein, or combinations thereof.

For a firmware or software implementation, methodologies may be implemented with modules (e.g., procedures, functions, and so on) that perform the functions described herein. Any machine-readable medium tangibly embodying instructions may be used in implementing the methodologies described herein. For example, software codes may be stored in a memory, for example the memory of a mobile station, and executed by a processor. Memory may be implemented within the processor or external to the processor. As used herein the term "memory" refers to any type of long term, short term, volatile, nonvolatile, or other memory and is not to be limited to any particular type of memory or number of memories, or type of media upon which memory is stored.

It will, of course, also be understood that, although particular embodiments have just been described, claimed subject matter is not limited in scope to a particular embodiment or implementation. For example, one embodiment may be in hardware, such as implemented on a device or combination of devices, as previously described, for example. Likewise, although the claimed subject matter is not limited in scope in this respect, one embodiment may comprise one or more articles, such as a storage medium or storage media, as described above for example, that may have stored thereon instructions that if executed by a specific or special purpose system or apparatus, for example, may result in an embodiment of a method in accordance with claimed subject matter being executed, such as one of the embodiments previously described, for example. As one potential example, a specific or special purpose computing platform may include one or more processing units or processors, one or more input/output devices, such as a display, a keyboard or a mouse, or one or more memories, such as static random access memory, dynamic random access memory, flash memory, or a hard drive, although, again, the claimed subject matter is not limited in scope to this example.

In the preceding description, various aspects of the claimed subject matter have been described. For purposes of explanation, specific numbers, systems, or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted or simplified so as not to obscure claimed subject matter. While certain features have been illustrated or described herein, many modifications, substitutions, changes, or equivalents may now occur to those skilled in the art. It is, therefore, to be understood that the appended claims are intended to cover all such modifications or changes as fall within the true spirit of claimed subject matter.

What is claimed is:

1. A method comprising:
receiving one or more signals from one or more inertial sensors on a mobile device;
receiving a received power signal from a distance sensor on said mobile device;
inferring an orientation of said mobile device based, at least in part, on said one or more signals received from said one or more inertial sensors;
inferring a range of said distance sensor to a reflective object based, at least in part, on said inferred orientation; and
estimating a DC offset component of said received power signal based, at least in part, on said one or more signals received from said one or more inertial sensors.

2. The method of claim 1, wherein said inferred orientation comprises a face-up orientation and said reflective object comprises an indoor ceiling.

3. The method of claim 1, wherein said DC offset component is estimated to comprise substantially said received power signal.

4. The method of claim 1, wherein said one or more inertial sensors comprise a compass, gravitometer, gyroscope, pressure sensor, and/or an accelerometer.

5. The method of claim 1, wherein said distance sensor comprise an infrared sensor.

6. The method of claim 1, further comprising: determining whether to deactivate an LCD display based, at least in part, on said range of said distance sensor to said reflective object.

7. A method comprising:
receiving a received power signal from a distance sensor on a mobile device;
detecting a user event on said mobile device at a time;
inferring a range to a reflective object from said distance sensor at said time;
subtracting from said received power signal an expected reflected power value associated with said inferred range; and
estimating a DC offset component of said received power signal at said time responsive to said user event.

8. The method of claim 7, wherein said user event comprises a camera shutter click.

9. The method of claim 7, wherein said user event comprises entry of information (text message, calculate numbers, etc) via a user interface (by keypad, stylus, voice command, etc.).

10. The method of claim 7, further comprising:
time-stamping said received power signal with a receive-time;
determining whether said receive-time is within a particular time range of said time of said user event; and
initiating said estimating said DC offset component based, at least in part, on said determining.

11. The method of claim 7, further comprising:
receiving one or more signals from one or more inertial sensors on said mobile device; and
confirming said estimated DC offset component based, at least in part, on said one or more signals received from said one or more inertial sensors.

12. The method of claim 11, wherein said one or more inertial sensors comprise a compass, gravitometer, gyroscope, pressure sensor, and/or an accelerometer.

13. The method of claim 7, wherein said distance sensor comprise an infrared sensor.

14. The method of claim 7, further comprising:
determining whether to deactivate an LCD display based, at least in part, on said range of said distance sensor to said reflective object.

15. A mobile device comprising:
one or more inertial sensors to provide signals representative of orientation of said mobile device;

a distance sensor to provide a received power signal;
infer an orientation of said mobile device based, at least in part, on said signals provided by said one or more inertial sensors;
infer a range of said distance sensor to a reflective object based, at least in part, on said inferred orientation; and
a DC offset component manager to estimate a DC offset component of said received power signal based, at least in part, on said signals provided by said one or more inertial sensors.

16. The mobile device of claim 15, wherein said inferred orientation comprises a face-up orientation and said reflective object comprises an indoor ceiling.

17. The mobile device of claim 15, wherein said DC offset component is estimated to comprise substantially said received power signal.

18. The mobile device of claim 15, wherein said one or more inertial sensors comprise a compass, gravitometer, gyroscope, pressure sensor, and/or an accelerometer.

19. The mobile device of claim 15, wherein said distance sensor comprise an infrared sensor.

20. The mobile device of claim 15, wherein said distance sensor utilizes electromagnetic signals, audio signals, sonar signals, or any combination thereof.

21. The mobile device of claim 15, wherein said mobile device comprises: a cell phone, a PDA, a camera, or any combination thereof.

22. An apparatus comprising:
means for receiving one or more signals from one or more inertial sensors on a mobile device;
means for receiving a received power signal from a distance sensor on said mobile device;
means for inferring an orientation of said mobile device based, at least in part, on said one or more signals received from said one or more inertial sensors;
means for inferring a range of said distance sensor to a reflective object based, at least in part, on said inferred orientation; and
means for estimating a DC offset component of said received power signal based, at least in part, on said one or more signals received from said one or more inertial sensors.

23. The apparatus of claim 22, wherein said inferred orientation comprises a face-up orientation and said reflective object comprises an indoor ceiling.

24. The apparatus of claim 22, wherein said DC offset component is estimated to comprise substantially said received power signal.

25. The apparatus of claim 22, wherein said one or more inertial sensors comprise a compass, gravitometer, gyroscope, pressure sensor, and/or an accelerometer.

26. The apparatus of claim 22, wherein said distance sensor comprise an infrared sensor.

27. A mobile device comprising:
one or more inertial sensors to provide signals representative of orientation of said mobile device;
a distance sensor to provide a received power signal; and
a special purpose computing device configured to infer an orientation of said mobile device based, at least in part, on said signals provided by said one or more inertial sensors, infer a range of said distance sensor to a reflective object based, at least in part, on said inferred orientation, and estimate a DC offset component of said received power signal based, at least in part, on said signals provided by said one or more inertial sensors.

28. The mobile device of claim 27, wherein said inferred orientation comprises a face-up orientation and said reflective object comprises an indoor ceiling.

29. The mobile device of claim 27, wherein said DC offset component is estimated to be substantially said received power signal.

30. The mobile device of claim 27, wherein said one or more inertial sensors comprise a compass, gravitometer, gyroscope, pressure sensor, and/or an accelerometer.

31. The mobile device of claim 27, wherein said distance sensor comprise an infrared sensor.

32. The mobile device of claim 27, wherein said distance sensor utilizes electromagnetic signals, audio signals, sonar signals, or any combination thereof.

33. The mobile device of claim 27, wherein said mobile device comprises: a cell phone, a PDA, a camera, or any combination thereof.

34. A non-transitory article comprising: a storage medium comprising machine-readable instructions stored thereon that are executable by a special purpose computing device to:
receive one or more signals from one or more inertial sensors on a mobile device;
receive a received power signal from a distance sensor on said mobile device;
inferring an orientation of said mobile device based, at least in part, on said one or more signals received from said one or more inertial sensors;
inferring a range of said distance sensor to a reflective object based, at least in part, on said inferred orientation; and
estimate a DC offset component of said received power signal based, at least in part, on said one or more signals received from said one or more inertial sensors.

35. The article of claim 34, wherein said inferred orientation comprises a face-up orientation and said reflective object comprises an indoor ceiling.

36. The article of claim 35, wherein said DC offset component is estimated to be substantially said received power signal.

37. The article of claim 34, wherein said one or more inertial sensors comprise a compass, gravitometer, gyroscope, pressure sensor, and/or an accelerometer.

38. The article of claim 34, wherein said distance sensor comprise an infrared sensor.

* * * * *